Figure 1A:
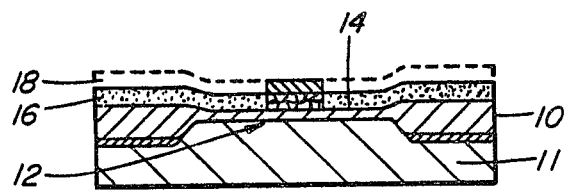

United States Patent [19]

Naem et al.

[11] 4,415,383

[45] Nov. 15, 1983

[54] METHOD OF FABRICATING SEMICONDUCTOR DEVICES USING LASER ANNEALING

[75] Inventors: Abdalla A. H. Naem, Ottawa; Iain D. Calder, Nepean; Hussein M. Naguib, Kanata, all of Canada

[73] Assignee: Northern Telecom Limited, Montreal, Canada

[21] Appl. No.: 376,687

[22] Filed: May 10, 1982

[51] Int. Cl.³ .................. H01L 21/268; H01L 21/28
[52] U.S. Cl. .................................. 148/187; 148/187; 29/571; 29/578; 156/643
[58] Field of Search .............. 148/187, 1.5; 29/578, 29/571; 156/643

[56] References Cited

U.S. PATENT DOCUMENTS

| | | | |
|---|---|---|---|
| 3,943,542 | 3/1976 | Ho et al. | 148/187 X |
| 4,059,461 | 11/1977 | Fan et al. | 148/1.5 |
| 4,219,379 | 8/1980 | Athanas et al. | 29/571 X |
| 4,319,954 | 3/1982 | White et al. | 148/1.5 X |
| 4,377,031 | 3/1983 | Goto et al. | 148/1.5 X |
| 4,377,902 | 3/1983 | Shinada et al. | 148/187 X |

*Primary Examiner*—G. Ozaki
*Attorney, Agent, or Firm*—Stuart L. Wilkinson

[57] ABSTRACT

In the manufacture of VLSI (very large scale integrated) MOS (metal-oxide-semiconductor) circuits, a polysilicon gate is deposited on an oxide layer overlaying a silicon substrate. Ideally, the polysilicon gate is made extremely small and with sharply defined vertical boundaries. The invention proposes depositing a polysilicon layer, covering a region of the layer with an antireflective coating, and laser annealing the layer. Laser radiation is absorbed to a higher level by the coated region than elsewhere and consequently the polysilicon layer in this region melts and recrystallizes into large grains. The polysilicon layer is then etched using etch conditions ensuring preferential etching of unrecrystallized polysilicon in comparison with recrystallized polysilicon. Consequently, except at the coated region, the polysilicon is etched quickly and there is very little undercutting of the gate region. Preferential etching methods based on differing dopant levels in polysilicon are known but do not produce the sharp edge definition enabled using the present process.

11 Claims, 7 Drawing Figures

METHOD OF FABRICATING SEMICONDUCTOR DEVICES USING LASER ANNEALING

This invention relates to a combined selective laser annealing and preferential etching process for producing polysilicon gates and interconnections for VLSI (very large scale integrated) circuits.

VLSI MOS (metal-oxide-semiconductor) circuits are characterized by high speed and packing density. These properties are achieved by processing the semiconductor wafer to produce devices which occupy a small area and have shallow junctions. VLSI MOS devices are typified by the MOS FET (field effect transistor), which consists of relatively high conductivity source and drain regions formed within a silicon substrate. A channel extends between the source and drain at the junction of the substrate with an overlying oxide layer. A highly conducting gate overlies the oxide layer above the channel region and conduction in the channel region is controlled by applying a voltage to the gate.

In a well-known fabrication process, an oxide layer is first grown on a silicon substrate and then a polysilicon layer is deposited over the oxide layer. The polysilicon layer is etched to leave the required small gate region and then is doped by phosphorus diffusion to render it more conducting. These steps are performed using conventional photolithographic techniques.

A problem with this fabrication process is that the junction formation in the source and drain regions of the device and the phosphorus diffusion into the polysilicon are normally carried out in one process. In that case, the diffusion may not be sufficient to decrease the polysilicon resistance because extensive impurity diffusion must be avoided in the formation of a shallow junction at the source and drain. Since the same polysilicon is used for gate electrodes and for interconnections in integrated circuits, its resistance must be lowered to fabricate high speed devices.

One way to decrease the polysilicon resistance is to carry on the phosphorus doping after or during the deposition of the film. In this case, however, it is difficult to pattern the polysilicon precisely and uniformly. Such high quality patterning is necessary, since threshold voltages of small geometry devices are highly sensitive to channel dimensions, (length and/or width), of less than $3\mu m$. Therefore, doping during deposition is not practical for small geometry devices since a uniform threshold voltage cannot be obtained.

Yamanaka et al, Journal of the Electrochemical Society, Volume 126, (1979), page 1415, describe an alternative method for decreasing polysilicon resistance. This technique is based on the use of two individual diffusion processes; one is for achieving low resistivity polysilicon interconnects and the other is for obtaining shallow junctions in the source and drain regions. In addition, improved patterning of the polysilicon is achieved by a third diffusion step and the use of a 1:5 etch rate difference between phosphorus doped and undoped polysilicon. However, the disadvantage if this technique is the significant amount of undercut (as large as 70%) due to phosphorus diffusion into the undoped gate thereby limited the minimum channel length required for the fabrication of small geometry devices.

According to the present invention, there is provided in a process of making silicon integrated circuits, the steps of depositing a layer of polysilicon on an insulating layer, covering a region of the polysilicon with an antireflective coating, directing laser radiation at the polysilicon layer to recrystallize only an area of the polysilicon under the antireflective coating, and etching the polysilicon layer using etch conditions ensuring preferential etching of recrystallized polysilicon in comparison to unrecrystallized polysilicon.

Preferably the antireflective coating is a layer of silicon nitride ($Si_3N_4$). The insulating layer is typically a layer of silicon dioxide ($SiO_2$) produced by oxidation of the silicon substrate. The laser radiation can be the output radiation from a continuous wave argon laser.

The etching is preferably carried out using plasma etching in an atmosphere of carbon tetrafluoride and oxygen at low pressure. Alternatively, wet etching can be performed using a mixture of hydrofluoric acid, nitric acid and acetic acid. In the case of plasma etching, the etch rate of unannealed polysilicon is about 11 times higher than that of laser annealed polysilicon. In the case of wet etching, the etch rate ratio of laser annealed and unannealed polysilicon is about 1:15.

The laser annealing can produce a grain size increase from about 500 Å in intially deposited polysilicon to large crystals greater than $2 \mu m \times 20 \mu m$ in the gate region.

Other process steps in the fabrication of VLSI MOS devices which are well known in the art are used before laser annealing and after etching the polysilicon layer. These additional conventional steps will be described in the following specific description.

An embodiment of the invention will now be described by way of example with reference to the accompanying drawings in which:-

Figure 2:
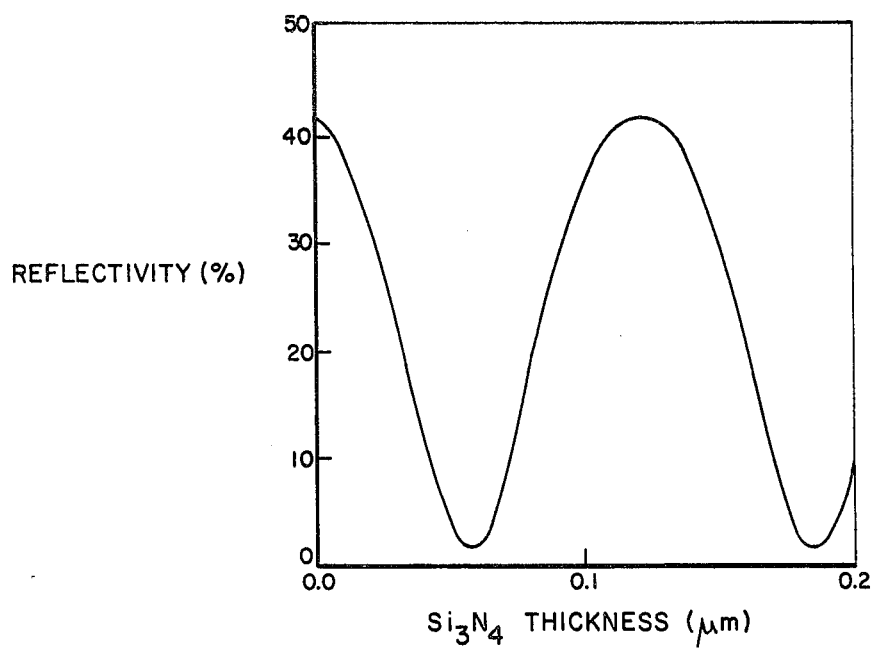
Figure 3:
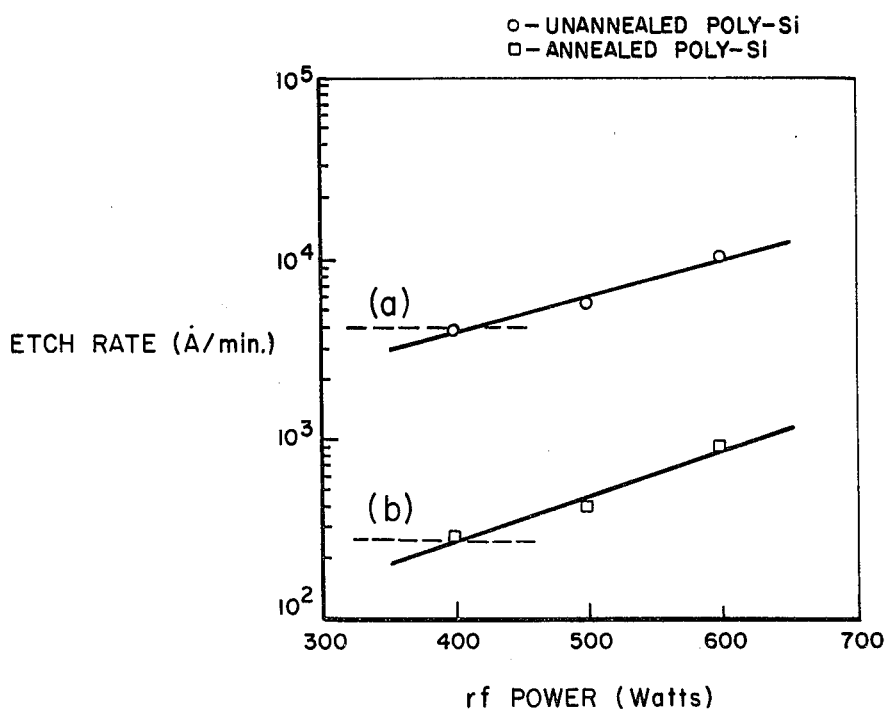

FIGS. 1(a) to (e) are sectional view of a part of a silicon wafer showing stages in the fabrication of a VLSI MOS device using a method according to the invention;

FIG. 2 is a graph showing the variation in reflectivity as a function of the thickness of a $Si_3N_4$ coating used in the method; and FIG. 3 is a graph comparing the etch rates of unannealed and laser annealed polysilicon.

Referring to FIG. 1 in detail, in the fabrication of a VLSI MOS device incorporating the n-channel, polysilicon gate MOS transistor shown in FIG. 1, a thick field oxide layer 10 is formed and a channel region 12 is defined on a silicon substrate 11 by a standard localized thermal oxidation technique.

After growing a 500 Å layer of gate oxide 14, a low pressure chemical vapour deposited (LPCVD) layer 16 of undoped polysilicon having a thickness of 0.5 $\mu m$ is deposited at 650° C. on the oxide layers 10 and 14. Subsequently a 600 Å layer 18 of silicon nitride ($Si_3N_4$), is LPCVD deposited at 670° C. on the undoped polysilicon film. The nitride layer 18 is then patterned by standard photolithographic and etching techniques to limit it to a narrow 1-2 $\mu m$ strip 19 at the intended site of a transistor gate electrode or interconnection. A polysilicon region 21 under the nitride film 19 is then annealed using a continuous wave argon laser set to produce a beam diameter of 50 $\mu m$, an output power of 11 watts, and a scanning speed of 100 cm/s. The temperature of the substrate 11 is maintained at 500° C. during the laser annealing stage. Under the annealing conditions, the silicon nitride layer 19 functions as an antireflective coating which ensures selective laser recrystallization of the polysilicon region 21. The polysilicon in region 21 is melted by the laser beam and rapidly recrystallizes into large grains as shown in FIG. 1(a). An uncoated part 20 of the polysilicon layer is only slightly annealed and undergoes neither melting nor a major change in grain morphology.

The advantages of using silicon nitride as an antireflective coating in the selective laser annealing step are that it is compatible with silicon processing technology in terms of deposition, pattern definition, and etching selectivity with respect to polysilicon. Thus the nitride layer adheres well to the polysilicon and neither chemically affects nor is chemically affected by other materials used in the MOS structure. In addition silicon nitride is transparent at the argon laser wavelength (500 nm) and its refractive index, $n_{AR}=1.95$, is less than that of polysilicon, $n_{Si}=4.2$, and very close to the ideal value of $n^2_{AR}=n_{Si}$, for minimum reflection. These optical properties of silicon nitride ensure maximum absorption of laser energy which is required in order to melt the underlying polysilicon film.

The amount of radiation energy absorbed by the polysilicon beneath the nitride layer is also critically dependent on the thickness of the nitride layer as shown in FIG. 2. Therefore, the choice of a 600 Å thick antireflective layer is crucial for successful selective laser annealing.

As a result of the selective laser annealing step, the resistivity of the polysilicon region 21 is halved and its grain size increases from around 600 Å to greater than 2 μm by 20 μm.

Figure 1B:
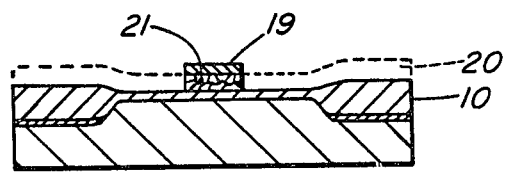

Referring to FIG. 1(b), once the annealing step is completed, unmasked slightly annealed polysilicon 20 is etched away using either a plasma or wet etching technique. Plasma etching is carried out in an atmosphere of carbon tetrafluoride and 5% oxygen at a pressure of 0.4 torr. The etch rate is dependent upon applied radio frequency power which is typically between 400 and 600 watts. As shown in the FIG. 3 graph, the etch rate of the unannealed polysilicon is about 11 times higher than that of the annealed polysilicon. Wet etching is carried out in a mixture of hydrofluoric acid, nitric acid and acetic acid. In this case, the etch rate difference between annealed and unannealed polysilicon areas is about 1:15. Using either wet or dry plasma etching techniques, precise and uniform patterning can be accomplished with less than 10% undercutting of the polysilicon gate region.

Figure 1C:
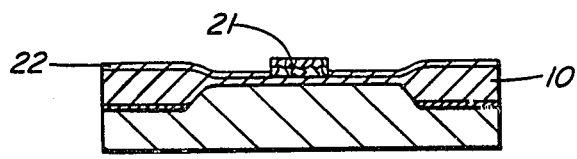

After the removal of the unannealed polysilicon layer 20, thermal oxidation is carried out to grow an additional 1000Å oxide layer 22 on the oxide layer 10 and the exposed part of oxide layer 14. As shown in FIG. 1(c), the silicon nitride region 19 is then removed using hot phosphoric acid. Phosphorus is then diffused into the laser annealed polysilicon 21 at 1000° C. for 12 to 16 minutes in a predeposition diffusion step. The diffusion of phosphorus into the polysilicon region 21 significantly reduces the resistance of the region 21 to a value of 0.5 mΩ-cm. The oxide layer 22 prevents phosphorus dopant from penetrating into source and drain regions 24 and 26 in the substrate 11. If phosphorus penetration did occur, it would render the source and drain too heavily doped and their junction with the substrate 11 too deep for efficient operation.

Figure 1D:
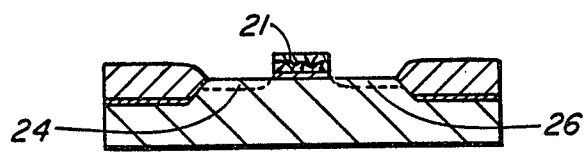
Figure 1E:
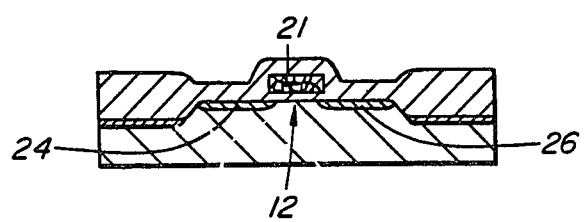

Using standard photolithographic techniques, the oxide over the source and drain regions 24 and 26 is etched away as shown in FIG. 1(d). The source and drain regions 24 and 26 are then doped using standard phosphorus predeposition and drive-in diffusion techniques to a required shallow junction depth of 0.2 to 0.5 nm. This latter step can alternatively be accomplished by ion implantation and post-implantation thermal annealing cycles as described by Colcaser in "Micro Electronics Processing and Device Design", John Wiley and Sons, N.Y. (1981), chapter 7. The diffusion and annealing steps cause further reduction in the resistivity of the polysilicon so improving the properties of this for the fabrication of high speed integrated circuits. After the doping of the source and drain regions 24 and 26, silicon dioxide is deposited using a well known technique to cover the exposed part of the channel 12 and the gate 21. Contact windows, (not shown) are then opened in the oxide and aluminum contacts are evaporated through the windows to contact the source and drain regions 24 and 26 to complete the fabrication of the n-channel, silicon gate MOS transistor.

As described previously, the VLSI devices obtained have gates or other polysilicon interconnections which can be made extremely small, of the order of 1–2 μm, and which have well-defined vertical edges. Although silicon nitride has properties which ideally suit it for use as an antireflective coating, other materials such as silicon dioxide can also be used. Although the embodiment of the invention described is an n-MOS FET, the invention can be used to make any silicon based integrated circuit device which has conductors formed from polysilicon.

What is claimed is:

1. In a method of making silicon integrated circuits, the steps of depositing a layer of polysilicon on an insulating layer, covering a region of the polysilicon with an antireflective coating, directing laser radiation at the antireflective coating, directing laser radiation at the polysilicon layer to recrystallize only an area under the antireflective coating, and etching the polysilicon layer using etch conditions ensuring preferential etching of unrecrystallized polysilicon in comparison to recrystallized polysilicon.

2. A method as claimed in claim 1, in which the antireflective coating is silicon nitride ($Si_3N_4$).

3. A method as claimed in claim 1, in which the insulating layer is silicon dioxide.

4. A method as claimed in claim 1, in which laser radiation is provided from a continuous wave argon laser.

5. A method as claimed in claim 1, in which the polysilicon layer is etched using a wet etchant comprising a mixture of hydrofluoric acid, nitric acid and acetic acid.

6. A method as claimed in claim 1, in which the polysilicon is plasma etched in a fluorine-based plasma.

7. A method as claimed in claim 1, in which the laser radiation produces in the polysilicon underlying the antireflective coating a change in grain size from approximately 500 Å to a crystal size of at least 2 μm × 20 μm.

8. A method as claimed in claim 1, in which the polysilicon under the antireflective coating is laser annealed sufficiently to produce at least a halving of resistivity in comparison with the unannealed polysilicon.

9. A method as claimed in claim 1, in which the ratio of etch rates of unannealed and laser annealed polysilicon is from 11:1 to 15:1.

10. A method as claimed in claim 1, comprising the further steps subsequent to the preferential etch step, of removing the antireflective coating and diffusing material into the exposed annealed polysilicon to significantly increase the conductivity thereof.

11. A method as claimed in claim 10, specifically for fabricating metal-oxide-semiconductor (MOS) transistors, the method further comprising exposing areas of the substrate at spaced locations adjacent respective ends of the laser annealed polysilicon and diffusing material into the substrate to a shallow depth to provide transistor source and drain regions.

* * * * *